(12) United States Patent
Mathew et al.

(10) Patent No.: US 7,446,001 B2
(45) Date of Patent: Nov. 4, 2008

(54) METHOD FOR FORMING A SEMICONDUCTOR-ON-INSULATOR (SOI) BODY-CONTACTED DEVICE WITH A PORTION OF DRAIN REGION REMOVED

(75) Inventors: Leo Mathew, Austin, TX (US); Lixin Ge, Austin, TX (US); Surya Veeraraghavan, Austin, TX (US)

(73) Assignee: Freescale Semiconductors, Inc., Austin, TX (US)

( * ) Notice: Subject to any disclaimer, the term of this patent is extended or adjusted under 35 U.S.C. 154(b) by 85 days.

(21) Appl. No.: 11/349,875

(22) Filed: Feb. 8, 2006

(65) Prior Publication Data

US 2007/0181946 A1 Aug. 9, 2007

(51) Int. Cl.
*H01L 21/336* (2006.01)
*H01L 29/06* (2006.01)

(52) U.S. Cl. .................. 438/283; 257/288; 257/619; 257/623; 257/E29.263; 257/E29.264

(58) Field of Classification Search ......... 257/347–349, 257/619, 623, E29.263, E29.264, 288; 438/283
See application file for complete search history.

(56) References Cited

U.S. PATENT DOCUMENTS

| | | | | |
|---|---|---|---|---|
| 4,753,895 A * | 6/1988 | Mayer et al. | ................ | 438/154 |
| 4,835,584 A * | 5/1989 | Lancaster | .................. | 257/330 |
| 4,906,587 A * | 3/1990 | Blake | ......................... | 438/151 |
| 4,922,315 A * | 5/1990 | Vu | .............................. | 257/507 |
| 5,008,723 A * | 4/1991 | van der Have | .............. | 257/386 |
| H1435 H * | 5/1995 | Cherne et al. | ............... | 257/347 |
| 5,821,575 A * | 10/1998 | Mistry et al. | ................ | 257/281 |
| 5,930,605 A * | 7/1999 | Mistry et al. | ................ | 438/149 |
| 5,932,911 A * | 8/1999 | Yue et al. | .................... | 257/330 |
| 6,111,296 A * | 8/2000 | Yamazaki et al. | ........... | 257/401 |
| 6,355,532 B1 * | 3/2002 | Seliskar et al. | .............. | 438/283 |
| 6,413,802 B1 * | 7/2002 | Hu et al. | ..................... | 438/151 |
| 6,429,487 B1 * | 8/2002 | Kunikiyo | ..................... | 257/354 |
| 6,538,284 B1 * | 3/2003 | Riccobene et al. | .......... | 257/347 |
| 6,693,326 B2 * | 2/2004 | Adan | ......................... | 257/347 |
| 6,885,055 B2 * | 4/2005 | Lee | ............................. | 257/308 |
| 6,936,875 B2 * | 8/2005 | Sugii et al. | .................. | 257/288 |
| 7,009,263 B2 * | 3/2006 | Enders et al. | ............... | 257/401 |

(Continued)

OTHER PUBLICATIONS

International Search Report and Written Opinion.

*Primary Examiner*—Thanh V Pham
*Assistant Examiner*—Alexander Belousov
(74) *Attorney, Agent, or Firm*—Joanna G. Chiu; Ranjeev Singh

(57) ABSTRACT

A method for making a semiconductor device includes patterning a semiconductor layer, overlying an insulator layer, to create a first active region and a second active region, wherein the first active region is of a different height from the second active region, and wherein at least a portion of the first active region has a first conductivity type and at least a portion of the second active region has a second conductivity type different from the first conductivity type in at least a channel region of the semiconductor device. The method further includes forming a gate structure over at least a portion of the first active region and the second active region. The method further includes removing a portion of the second active region on one side of the semiconductor device.

18 Claims, 9 Drawing Sheets

U.S. PATENT DOCUMENTS

2002/0185687 A1* 12/2002 Koh et al. .................. 257/347
2003/0201442 A1* 10/2003 Makita ........................ 257/66
2004/0108559 A1* 6/2004 Sugii et al. ................. 257/411
2005/0001216 A1* 1/2005 Adkisson et al. .............. 257/66
2005/0020015 A1* 1/2005 Mathew et al. ............. 438/277
2005/0127442 A1 6/2005 Veeraraghavan et al.
2005/0250317 A1* 11/2005 Koh et al. ................... 438/653

* cited by examiner

METHOD FOR FORMING A SEMICONDUCTOR-ON-INSULATOR (SOI) BODY-CONTACTED DEVICE WITH A PORTION OF DRAIN REGION REMOVED

FIELD OF THE INVENTION

The present invention relates generally to semiconductor devices, and more specifically, to method and apparatus for forming a semiconductor-on-insulator (SOI) body-contacted device.

RELATED ART

Body-contacted SOI transistors are typically built with a polysilicon gate separating the source/drain regions from the body contact region. The additional circuit loading capacitance due to this body-tie is substantial. Also, in high current applications, such as in input/output (I/O) buffers, body-contacted SOI transistors of greater widths are needed. However, as the gate width increases, the resistance along the body of the transistor to the body contact also increases. This resistance may result in portions of the body not being properly tied via the body-contact, as needed for proper operation. Therefore, there is a need for an improved body-contacted SOI transistor.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one embodiment, a body-contacted semiconductor-on-insulator (SOI) is formed having first and second active regions having different heights. Also, in at least a channel region, the first and second active regions are of different conductivity types. The use of these active regions of different heights and different conductivity types may allow for improved electrical contact to the body of the SOI transistor.

Figure 1:
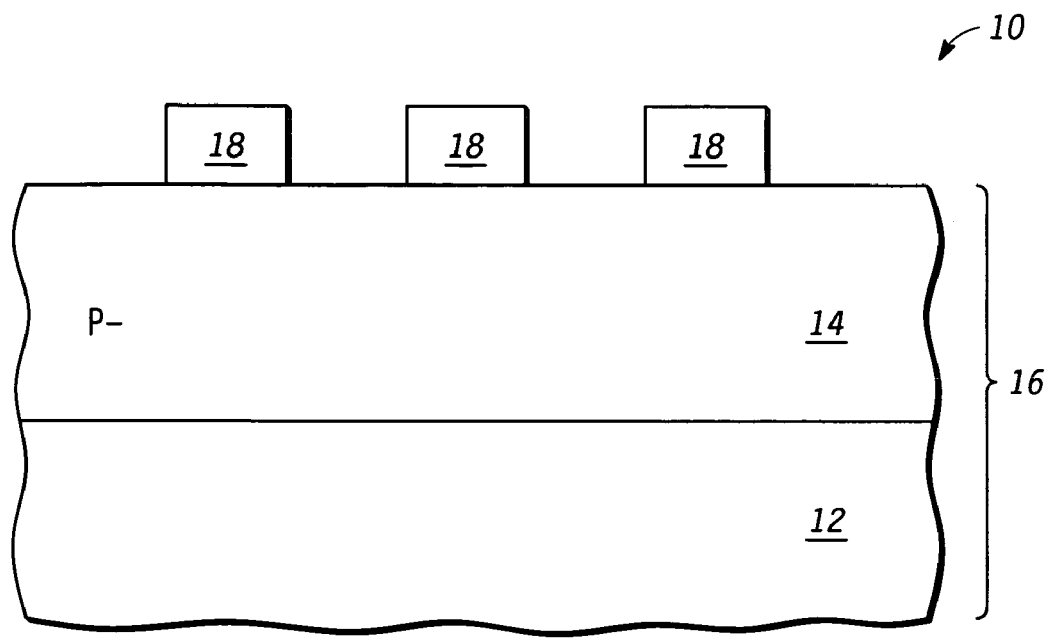
FIGS. 1-5, 10-12, and 15 illustrate cross-sectional views of various steps used in forming a body-contacted SOI transistor in accordance with one embodiment of the present invention.

FIG. 1 illustrates a cross-sectional view of semiconductor structure 10 in accordance with one embodiment of the present invention. Semiconductor structure 10 includes a semiconductor substrate 16 and a patterned masking layer 18 formed over semiconductor substrate 16. Semiconductor substrate 16 is a semiconductor-on-insulator (SOI) substrate including a semiconductor layer 14 overlying an insulating layer 12. Semiconductor layer 14 may include any type of semiconductor material such as, for example, silicon, silicon-germanium, gallium-arsenide, gallium-nitride, or combinations thereof. In one embodiment, semiconductor layer 14 includes silicon, in which case substrate 16 may specifically be referred to as a silicon-on-insulator substrate. In the illustrated embodiment, formation of an n-type device will be described. Therefore, in the illustrated embodiment, semiconductor layer 14 is lightly doped with p-type dopants, such as, for example, boron or $BF_2$, as indicated by the label "P–" in FIG. 1. In one embodiment, this is achieved by performing a p-type implant using a dopant dosage in a range of approximately 1e15 to 1e18/cm$^3$. Afterwards, an anneal can be performed to more evenly distribute the dopant. Also, note that semiconductor structure 10 may also be referred to as semiconductor device 10 since eventually, it will become a device in subsequent figures.

Insulating layer 12 may include any type of insulating materials. In one embodiment, insulating layer 12 includes an oxide and may be referred to as a buried oxide. In one embodiment, patterned masking layer 18 is a hardmask layer, and may be formed using known semiconductor processing techniques. Patterned masking layer 18, as will be seen further below, is used to define active areas of different heights.

Figure 2:
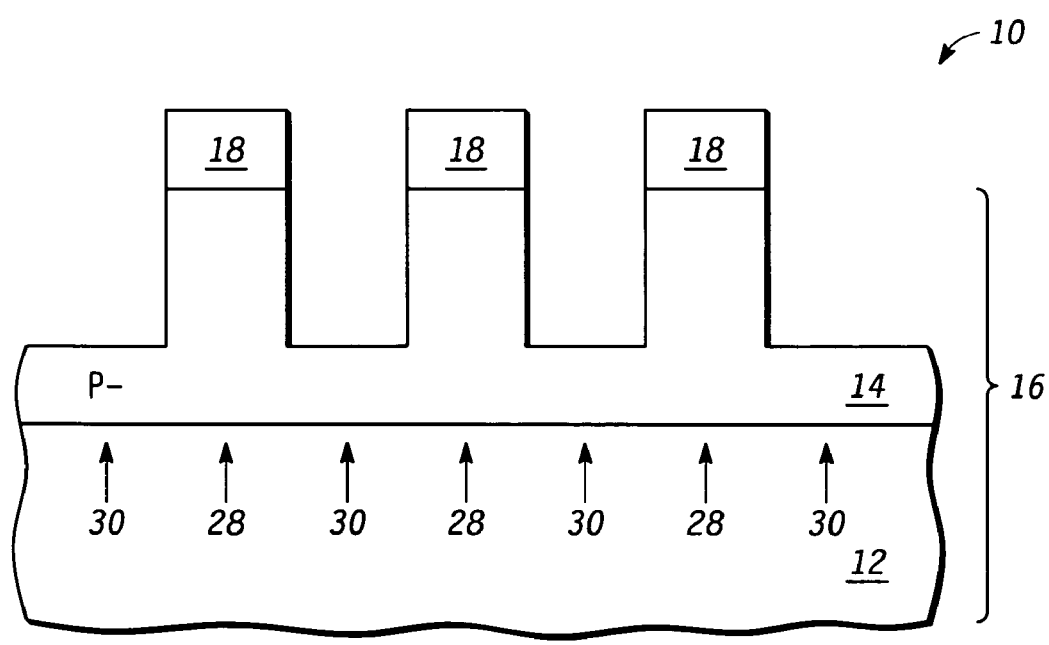

FIG. 2 illustrates semiconductor structure 10 after portions of semiconductor layer 14, exposed by patterned masking layer 18, are removed. For example, an anisotropic etch may be used to remove portions of semiconductor layer 14, where the etch extends into semiconductor layer 14 but does not extend completely through semiconductor layer 14. Therefore, the etch of FIG. 2 results in semiconductor layer 14 having higher portions 28 and lower portions 30.

Figure 3:
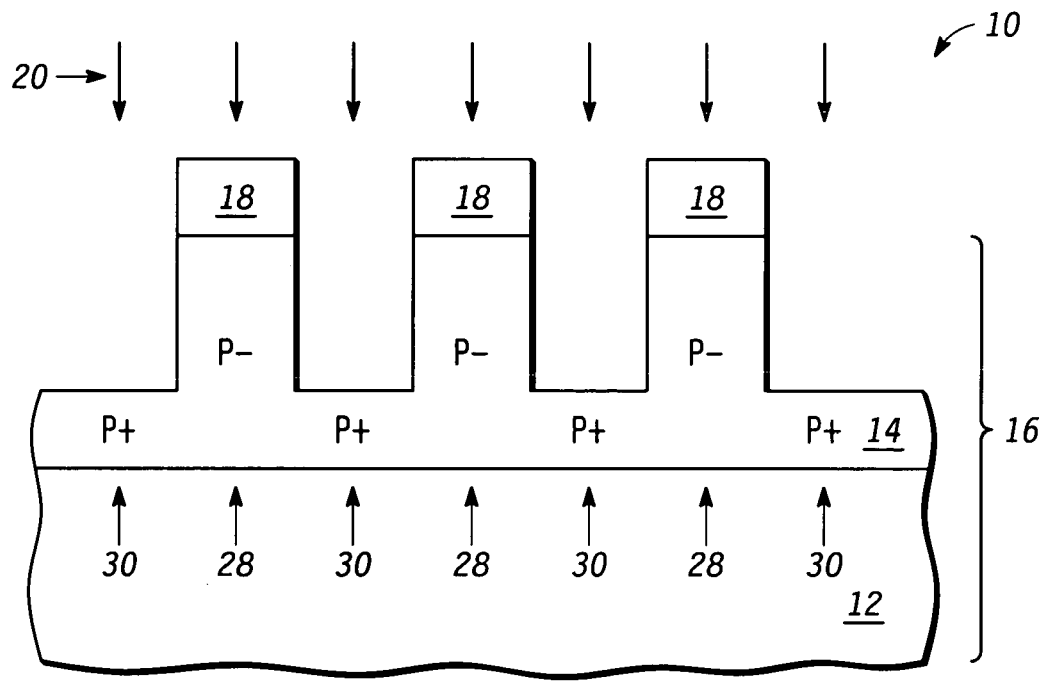

FIG. 3 illustrates performing an implant 20 into semiconductor layer 14. In the illustrated embodiment, implant 20 is a p-type implant using, for example, boron or $BF_2$ as the dopant with a dopant concentration in a range of approximately 1e18 to 1e20/cm$^3$. Therefore, note that higher portions 28 of semiconductor layer 14, which were protected by patterned masking layer 18, remain lightly doped (as indicated by the P–), whereas lower portions 30 of semiconductor layer 14, which were exposed by patterned masking layer 18, are now heavily doped due to implant 20, as indicated by the P+ in these portions.

Figure 4:
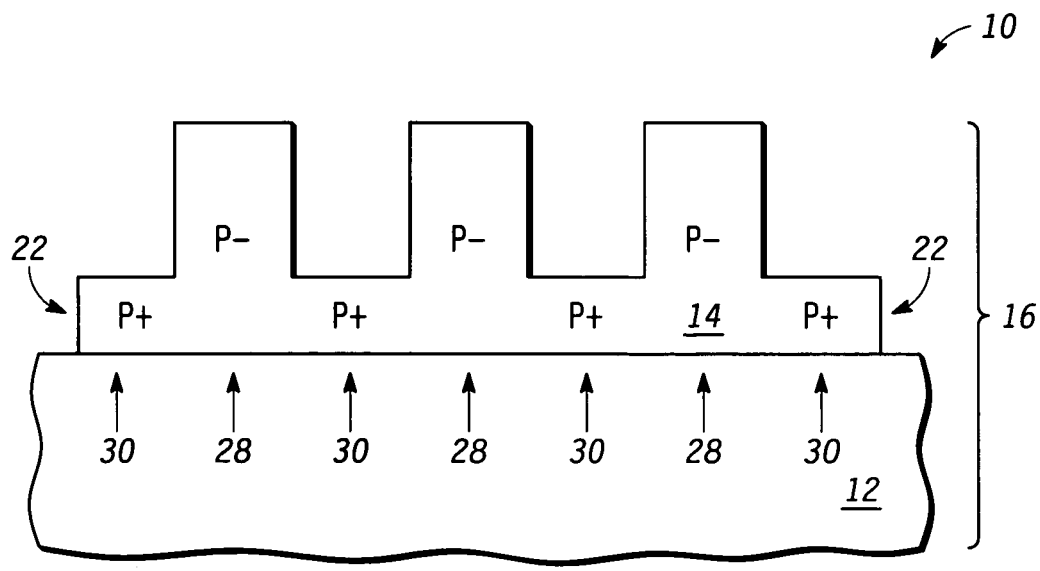

FIG. 4 illustrates semiconductor structure 10 after formation of isolation regions 22 to isolate semiconductor layer 14 from other surrounding devices and after removal of patterned masking layer 18. Known patterning and etching techniques may be used to form isolation regions 22. Note that, in one embodiment, isolation region 22 surrounds semiconductor layer 14, where semiconductor layer 14 provides the active area (i.e. active region) for the SOI device being formed. Patterned masking layer 18 may also be removed using conventional processing techniques.

Figure 5:
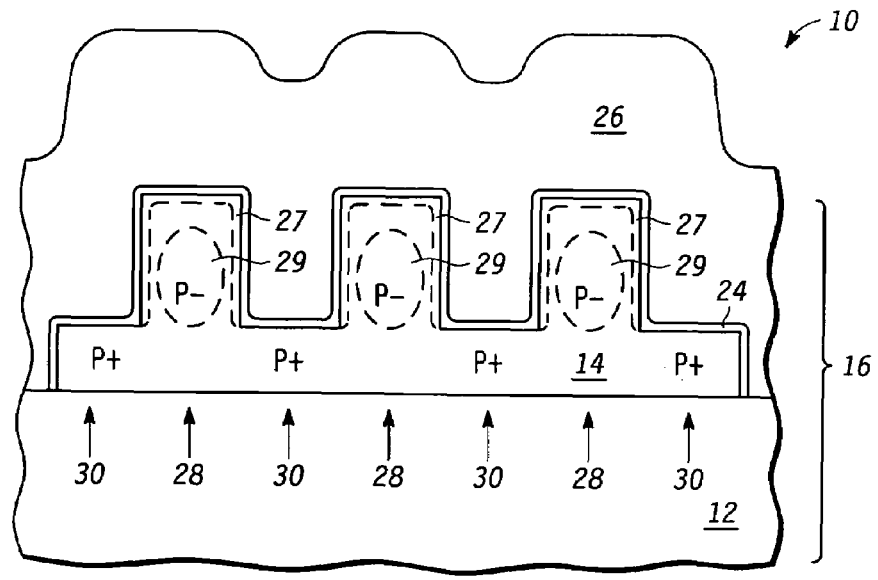

FIG. 5 illustrates semiconductor structure 10 after formation of a gate dielectric 24 over semiconductor layer 14 and a gate 26 over gate dielectric layer 24. In one embodiment, a gate dielectric layer and a gate electrode layer are blanket deposited over substrate 16 and are then patterned to form gate dielectric 24 and gate 26 (where gate 26 may also be referred to as a gate electrode). This patterning, as will be seen in the top-down views, defines a gate structure across a middle portion of semiconductor layer 14 where portions of the gate layer and gate dielectric layer behind and in front of the page were removed. Note that gate 26 and gate dielectric 24 together may be referred to as a gate structure. In one embodiment, gate 26 is a polysilicon gate, however, in alternate embodiments, other materials or different combinations of materials may be used for gate 26. In one embodiment, gate dielectric 24 includes an insulator such as oxide or nitride. In alternate embodiments, other materials or different combinations of materials may be used for gate dielectric 24.

Semiconductor layer 14, which provides the active area for the device (and may therefore also be referred to as the active area or active region), includes a channel region 27 formed along gate dielectric 24 in higher portions 28 which are lightly doped (e.g. P−). Also, semiconductor layer 14 includes a body region 29 located in inner portions of higher portions 28, outside channel region 27. The lower portions 30 under gate 26 (e.g. the P+portions) provide body ties or contacts between the different portions of body region 29 located in each higher portion 28. Therefore, note that higher portions 28 may be referred to as a first active region, and lower portions 30 may be referred to as a second active region, where the first and second active regions have different heights and different conductivity types (e.g. P− vs. P+, respectively, in the illustrated embodiment). Channel region 27 and body region 29 are illustrated in FIG. 5 with dotted lines and indicate the general location of these regions since the boundaries of these regions are not clearly defined. However, note that in a typical planar device, the body region usually refers to the region of the active area located below the channel region, where the channel region is a region below the gate where the channel forms during operation of the device.

Figure 6:
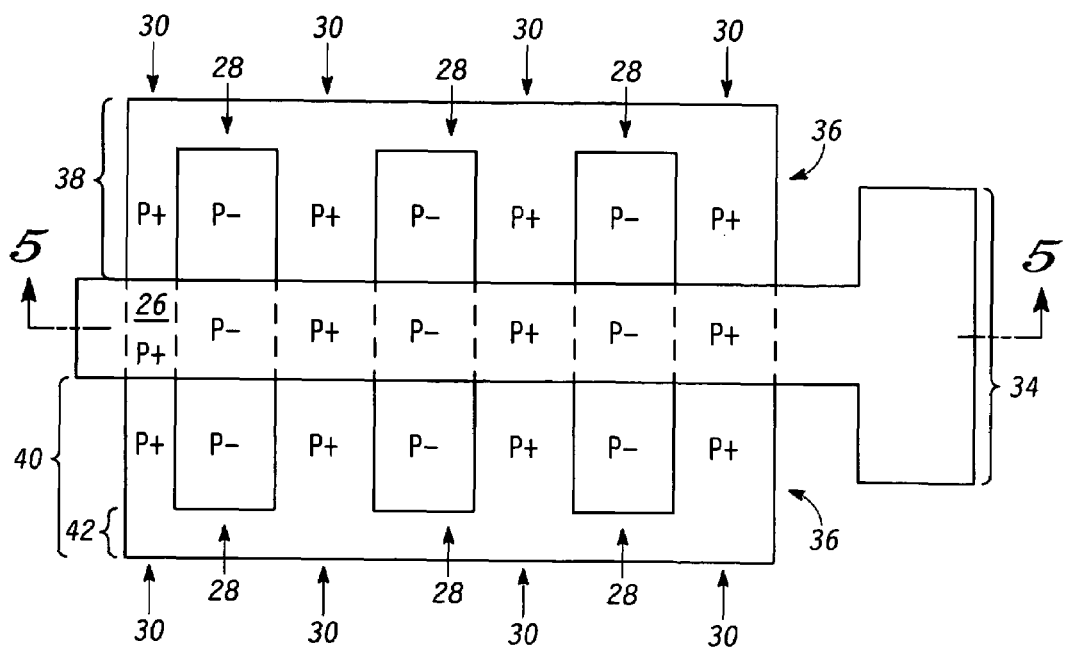
FIGS. 6-9, 13, 14, and 16 illustrate top-down views of various steps used in forming the body-contacted SOI transistor illustrated in the cross-sectional views of FIGS. 1-5, 10-12, and 15, in accordance with one embodiment of the various embodiment.

FIG. 6 illustrates a top-down view of semiconductor structure 10, where FIG. 5 corresponds to a cross-sectional view taken through a middle of gate 26, as illustrated in FIG. 6. As can be seen in the top-down view of FIG. 6, semiconductor layer 14 extends out from under both sides of gate 26, forming active region 36. The upper portion of active region 36, above gate 26 as illustrated in FIG. 6, corresponds to a drain region 38, and the lower portion of active region 36, below gate 26 as illustrated in FIG. 6, corresponds to a source region 40. Also, note lower portions 30 extend out further from gate 26 than higher portions 28. Therefore, patterned masking layer 18, described above, is formed such that lower portions 30 extend further than higher portions 28, where the illustrated portions of patterned masking layer 18 above in FIG. 1 would have a shape corresponding to higher portions 28 when viewed from a top-down perspective. Also, note that channel region 27 and body region 29 are be located in those areas of higher portion 28 which underlie gate 26. In an alternate embodiment, patterned masking layer 18 may be formed such that lower portions 30 do not extend further from gate 26 than higher portions 28, or that they only extend further in source region 40 and not in drain region 38. Also, the portion of lower portions 30 which extends further than higher portions 28 in source side 40 may be referred to as a lower portion extension region 42. FIG. 6 also illustrates a contact region 34 of gate 26 where a gate contact may be formed.

Figure 7:
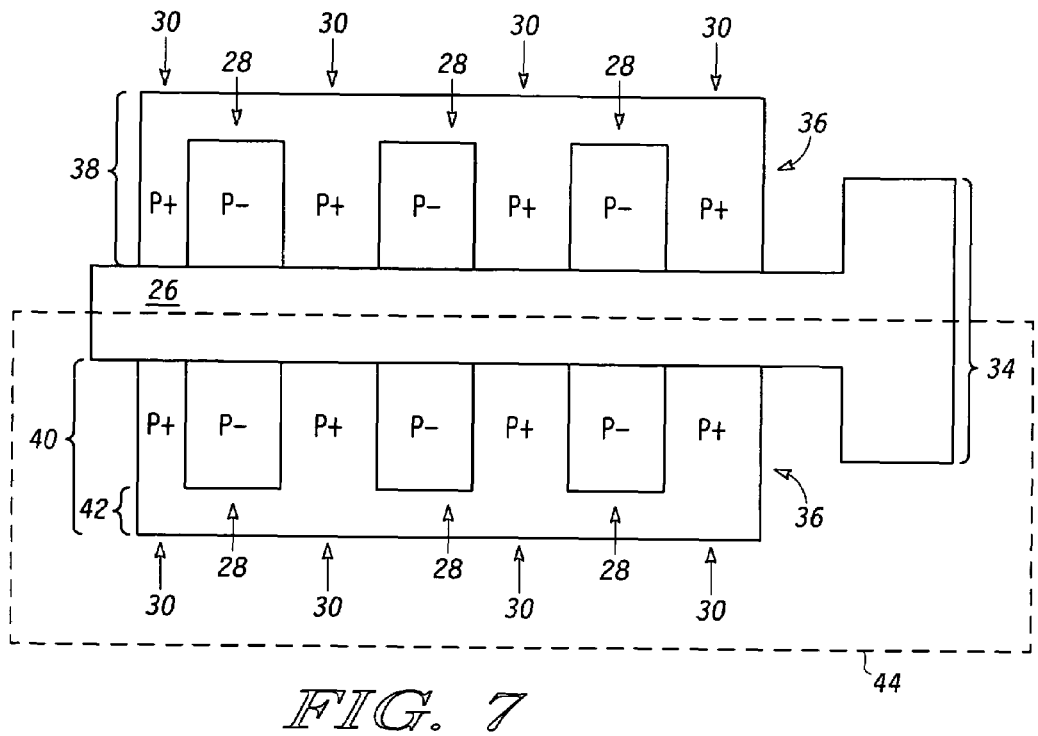
Figure 8:
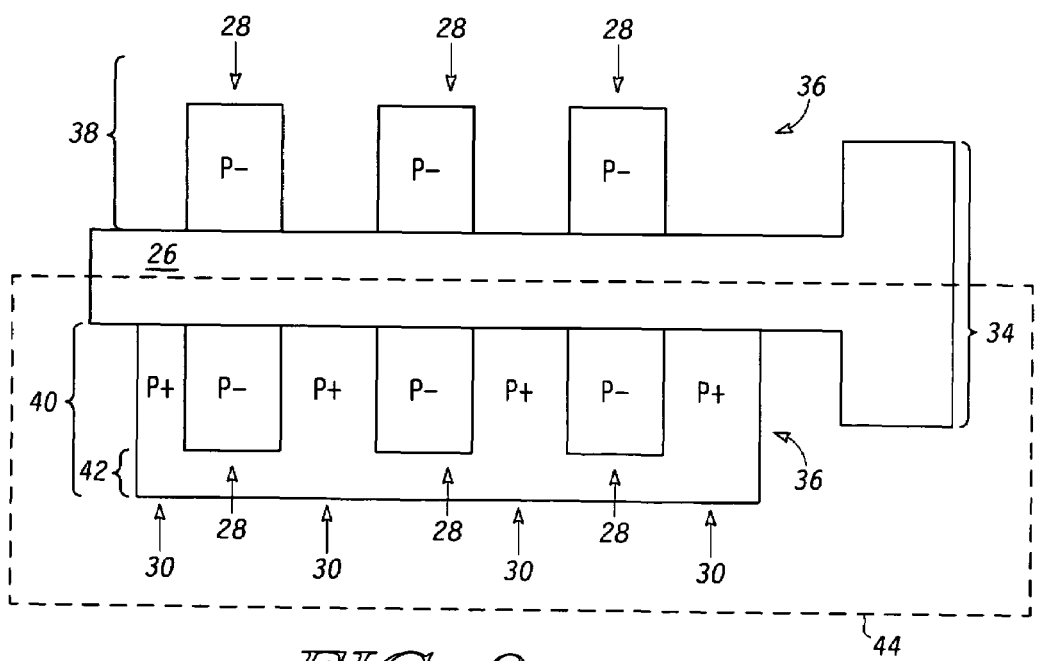

FIG. 7 illustrates a top-down view of semiconductor structure 10 after formation of a patterned masking layer 44 which covers source region 40. Patterned masking layer 44 may be formed using known semiconductor processing techniques. As illustrated in FIG. 8, patterned masking layer 44 is used to protect source region 40 while removing lower portions 30 from drain region 38. For example, in one embodiment, an anisotropic etch may be performed to expose underlying insulating layer 12 between and around higher portions 28 in drain region 38, not covered by gate 26.

Figure 9:
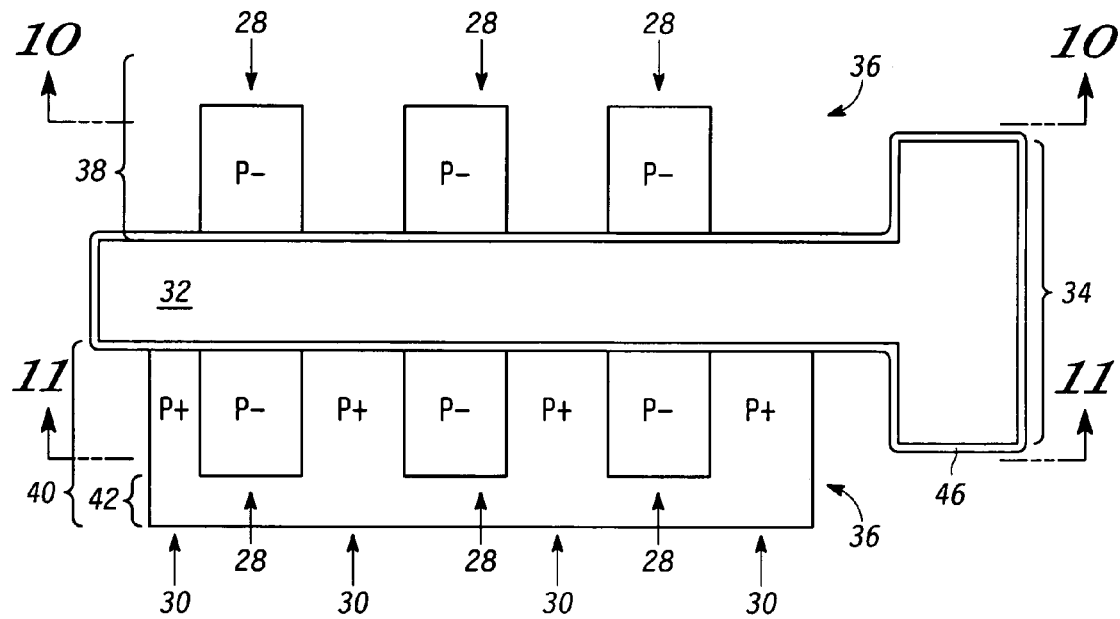

FIG. 9 illustrates semiconductor structure 10 after removal of patterned masking layer 44 (where conventional semiconductor techniques may be used to remove patterned masking layer 44) and after the formation of a gate spacer 46. Gate spacer 46 may be formed by blanket depositing one or more insulating layers, and then performing an anisotropic etch to result in gate spacer 46 surrounding gate 26. In one embodiment, gate 26 is thicker than semiconductor layer 14 such that an overetch may be performed in forming gate spacer 46. This overetch confines gate spacer 46 to the sidewalls of gate 26 while removing the spacer material from any of the sidewalls of semiconductor layer 14 (e.g. of higher and lower portions 28 and 30). In this manner, gate spacer 46 only surrounds gate 26, as illustrated in FIG. 9. However, in alternate embodiments, the formation of gate spacer 46 may be performed such that spacers are also formed on the sidewalls of semiconductor layer 14 (such as on the sidewalls of higher and lower portions 28 and 30).

Figure 10:
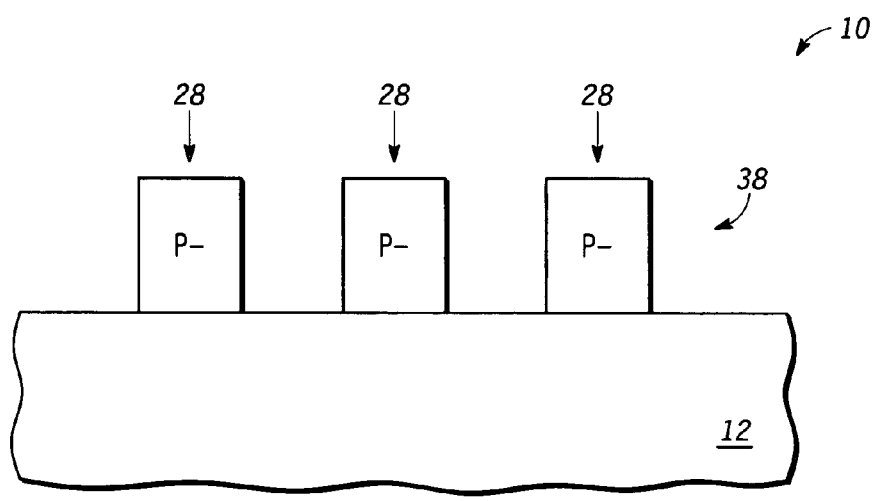

FIG. 10 illustrates a cross-sectional view of semiconductor structure 10 taken through drain region 38, as illustrated by the cross-section indicator in FIG. 9. Therefore, note that insulator layer 12 is exposed between higher portions 28, as was described above in reference to FIG. 8.

Figure 11:
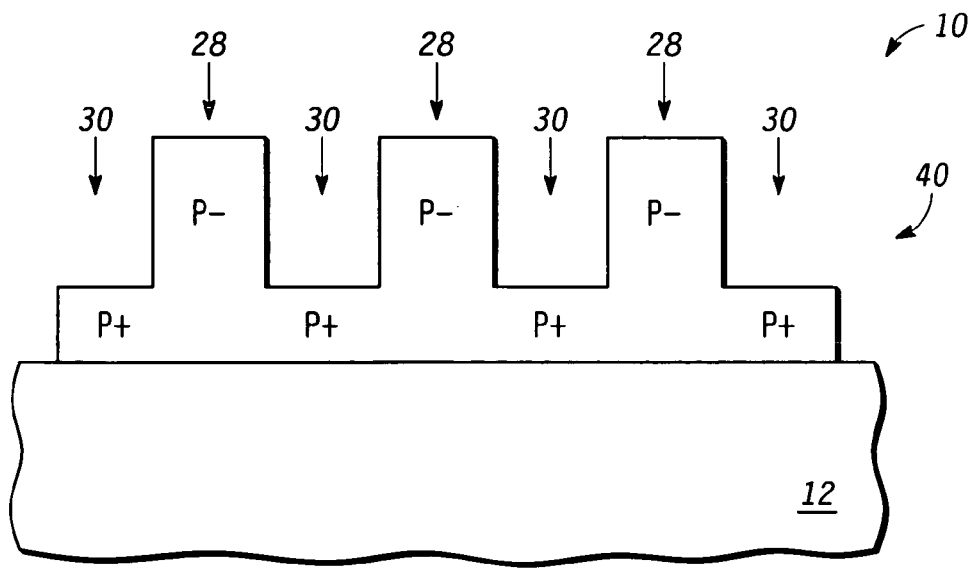

FIG. 11 illustrates a cross-sectional view of semiconductor structure 10 taken through source region 40, as illustrated by another cross-section indicator in FIG. 9. Therefore, note that in source region 40, both higher portions 28 and lower portions 30 remain.

Figure 12:
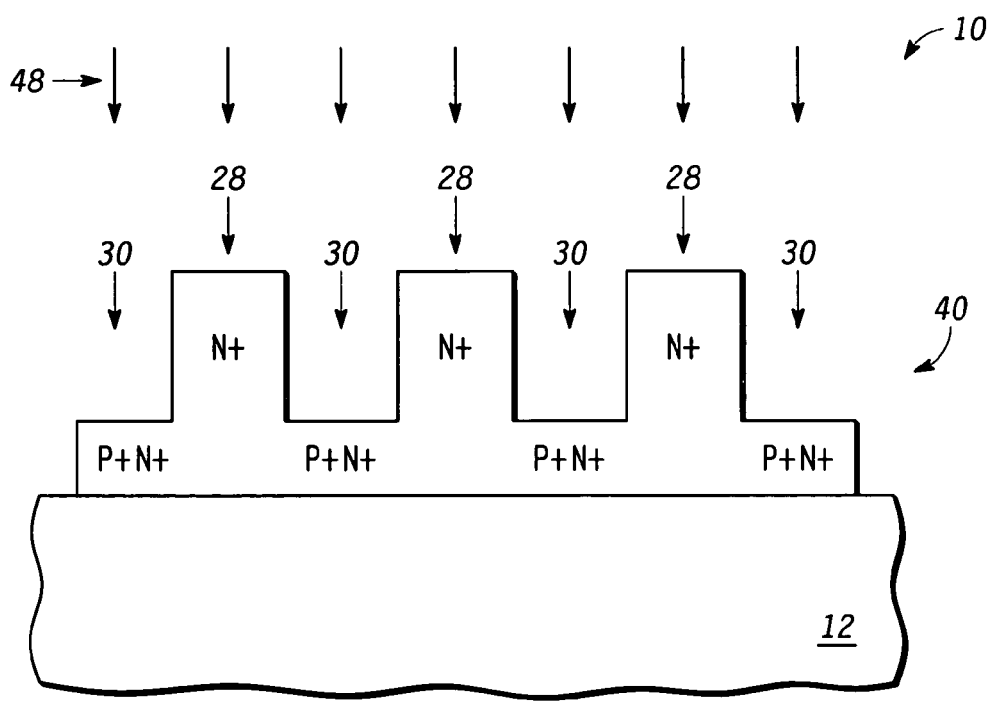

FIG. 12 illustrates performing a source/drain implant 48 into semiconductor layer 14. Source/drain implant 48 is performed into both source region 40 and drain region 38 of semiconductor structure 10. In the illustrated embodiment, in which an n-type device is being formed, source/drain implant 48 is performed using an n-type dopant such as, for example, phosphorous or arsenic. In one embodiment, a dopant concentration in a range of approximately 1e19 to 1e21/cm$^3$ is used.

Figure 13:
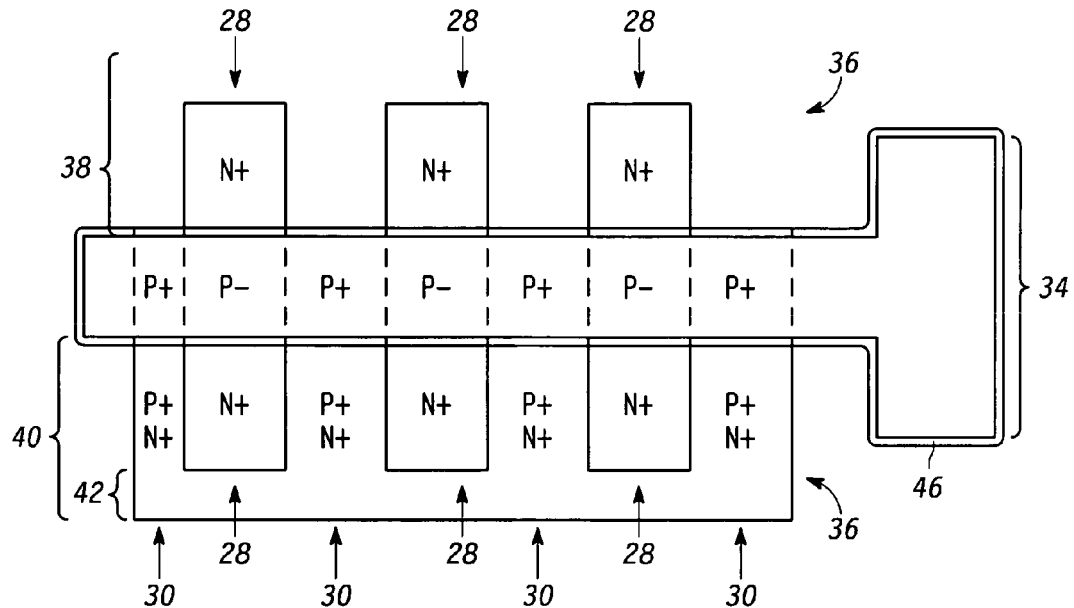

FIG. 13 illustrates a top-down view of semiconductor structure 10 after source/drain implant 48 of FIG. 12. Therefore, note that semiconductor layer 14 not covered by gate 26 in source region 40 and drain region 38 receive n-type dopants, such that higher portions 28 exposed by gate 26 in source region 40 and drain region 38 are heavily doped with n-type dopants (as indicated by the N+). Lower portions 30 in source region 40 also include n-type dopants but may also still include the p-type dopants (as indicated by the N+ in addition to the P+). That is, the n-type dopants of source/drain implant 48 may not fully counter the high concentration of p-type dopants in lower portions 30. Therefore, note that higher portions 28 underlying gate 26 have a different conductivity type from lower portions 30 of source region 40 (not underlying gate 26). In the illustrated embodiment, they have opposite conductivity types (e.g. P− and P+N+, respectively, where the N+ of lower portions 30 of source region 40 is of opposite conductivity type to the P− in higher portions 28 underlying gate 26). Also, note that in at least channel region 27, under gate 26, lower portions 30 and higher portions 28 have different conductivity types (remaining P− and P+, respectively).

Figure 14:
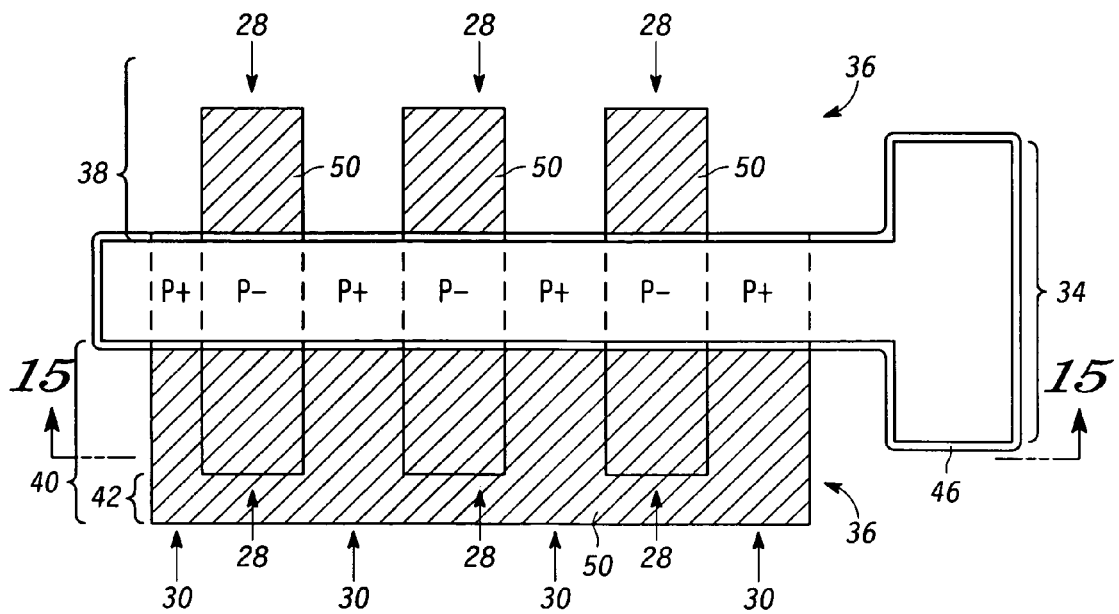
Figure 15:
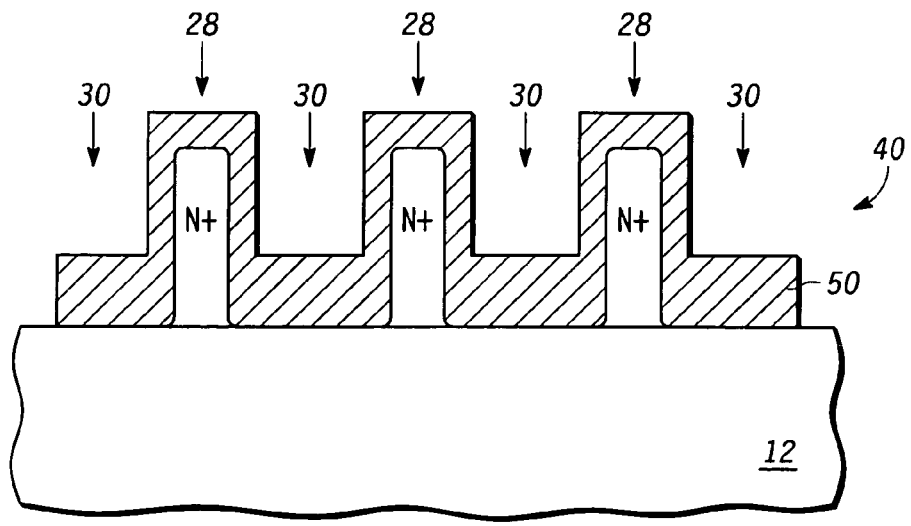

FIG. 14 illustrates semiconductor structure 10 after siliciding semiconductor layer 14 to form a silicide region 50 (which may also be referred to as a silicide layer). Siliciding may be performed to improve contact efficiency and reduce resistance. FIG. 15 illustrates a cross-sectional view of semiconductor structure 10 after siliciding taken through source region 40, as indicated by the cross-section indicator of FIG. 14. Note that in the illustrated embodiment, siliciding is performed such that silicide region 50 extends completely through lower portions 30 of semiconductor layer 14, reaching insulating layer 12. That is, the siliciding completely consumes semiconductor layer 14 in these lower portions. Note that silicide region connects higher portions 28 and lower portions 30 in source region 40, thus connecting the body of structure 10 and source of structure 10 to form a body-tied structure or device. Therefore, the existence of lower portions 30 allows for the ability to easily connect the body and source of structure 10 through silicidation.

Figure 16:
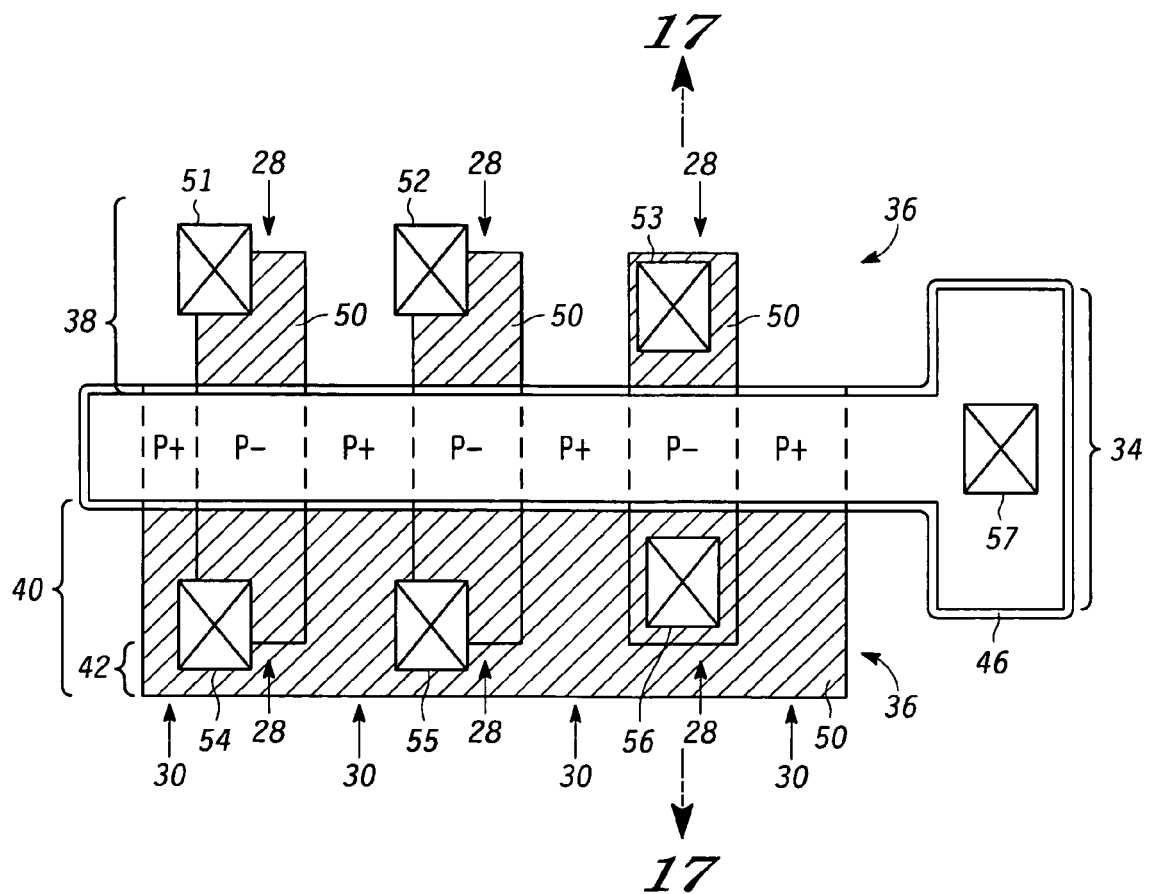

FIG. 16 illustrates a top-down view of semiconductor structure 10 after formation of contacts 51-57 to contact the source, drain, gate, and body of semiconductor structure 10. Contacts 51-53 may be formed to overlap a portion of higher portions 28 in drain region 38 (which forms the drain or drain structure of structure 10) or may be formed completely over a drain portion (such as contact 53). Contacts 54-56 to source region 40 (which forms the source or source structure of structure 10) provides body contacts along gate 26. Each of contacts 51-57 may include any conductive or metal-containing material.

Note that in the illustrated embodiment, multiple body contacts are provided along gate 26 (e.g. contacts 54-56) which tie (i.e. electrically connect) the source and body of structure 10 (i.e. device 10). This may provide for an improved body tie having lower resistance and capacitance, rather than the body tie having to extend all along a length of the gate from a body contact located further to the left or right of gate 26, such as beyond gate contact region 34, as would typically be done today. Also, the junction formed between higher portions 28 under gate 26 and higher portions 28 in source region 40 due to the different conductivity types (P− vs. N+ in the current embodiment) provides isolation between source region 40 and body region 29. For example, current attempting to flow from higher portion 28 in source region 40 into higher portion 28 under gate 26 would be unable to flow due to the junction created by the different conductivity types unless, during operation, an inversion region is created by gate 26. However, a body tie can still be provided by the lower portions 30 under gate 26 to lower portions 30 in source region 40 due to the silicidation and conductivity types of lower portion 30.

Figure 17:
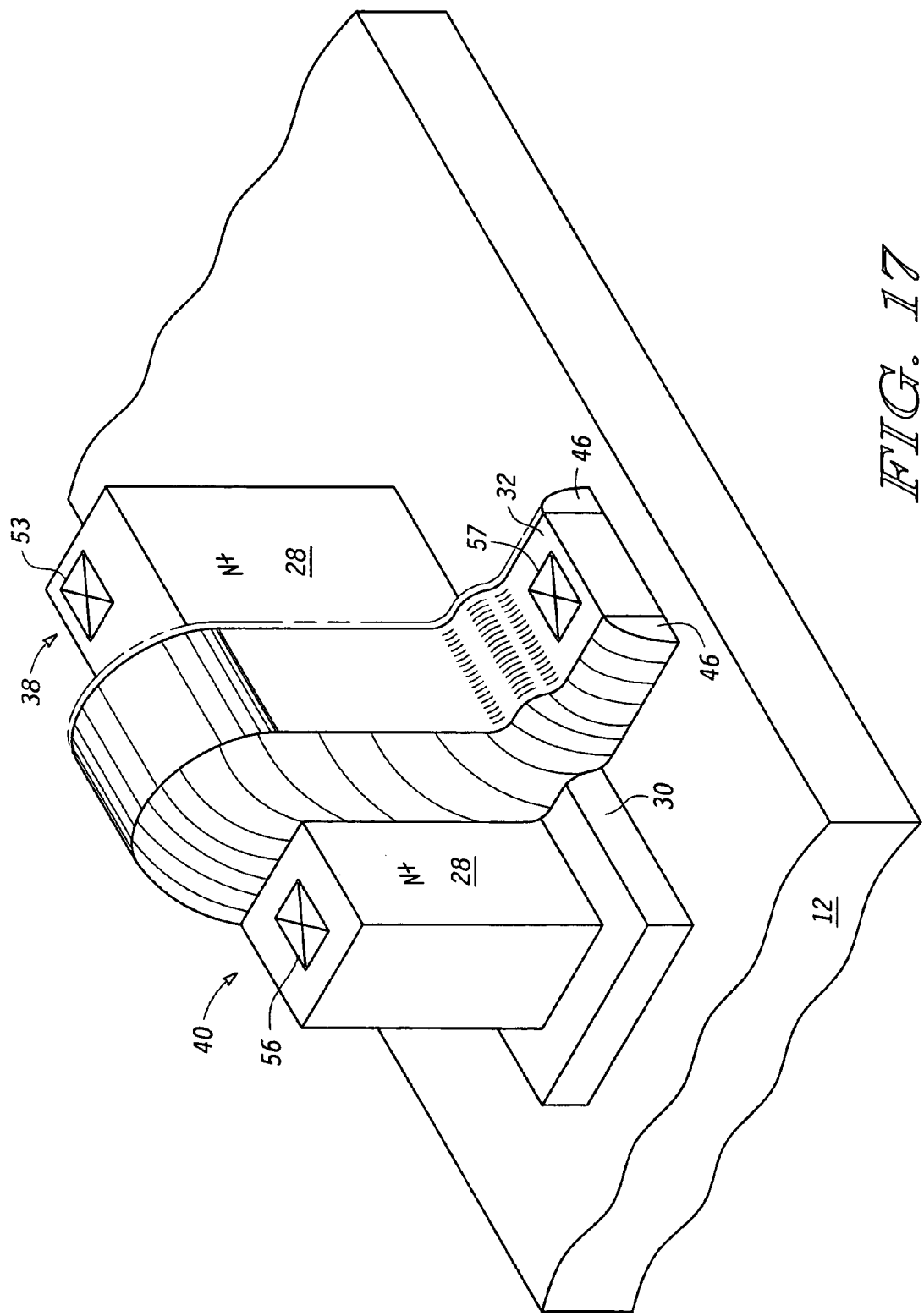
FIG. 17 illustrates a three-dimensional view of a portion of the body-contacted SOI transistor of FIG. 16, in accordance with one embodiment of the various embodiment.

FIG. 17 illustrates a three-dimensional view of a portion of semiconductor structure 10 as taken through one of higher portions 28 (indicated by a cross-section indicator in FIG. 16). Note that one side of the illustrated active region includes two levels of active region, each at different heights, with the lower one extending further out than the higher one. The lower one provides a contact region for the body of the device while the higher one provides a contact region for the source of the device. As described above, due to the silicidation and conductivity types of lower portions 30 and higher portions 28, a body-tied device is formed in which the source and body are electrically connected. In this manner, one or more contacts can then be formed which contacts both the body and source to form a body-contacted device. (Note that contact 56 is shown as only overlying the source portion; however, as was illustrated in FIG. 16, it may be formed such that it overlaps onto lower portion 30 as well.)

Note that although the above embodiments were described in reference to forming an n-type device, it should be understood that the methods and structures described herein also apply to p-type devices, where the conductivity types discussed in reference to the FIGs. would be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a semiconductor device, comprising:
    forming a semiconductor layer, overlying an insulator layer, to create a first active region and a second active region, wherein the first active region is of a different height from the second active region, and wherein at least a portion of the first active region is lightly doped and at least a portion of the second active region is heavily doped;
    forming a gate structure over a top portion and sidewall portions of the first active region and over at least a portion of the second active region, wherein a drain region is located on a first side of the gate structure and a source region is located on a second side, opposite the first side, of the gate structure, and wherein a channel region is located between the drain region and the source region and along the top portion and sidewall portions of the first active region, adjacent the gate structure; and
    after forming the gate structure, removing a portion of the second active region from only the drain region to expose the insulator layer.

2. The method of claim 1, wherein the at least a portion of the first active region is P− and the at least a portion of the second active region is P+.

3. The method of claim 1 further comprising masking the first active region and performing an implant into the second active region.

4. The method of claim 3, wherein the forming the gate structure further comprises forming a gate dielectric over the first active region and the second active region.

5. The method of claim 4, wherein the forming the gate structure further comprises forming a gate electrode layer over the gate dielectric.

6. The method of claim 5, wherein the removing the portion of the second active region from only the drain region further comprises masking the source region of the semiconductor device.

7. The method of claim 6 further comprising implanting dopants of a conductivity type opposite to a conductivity type of a semiconductor region under the gate structure.

8. The method of claim 7 further comprising siliciding the first active region and the second active region to form a silicide region connecting the first active region and the second active region.

9. The method of claim 8 further comprising forming at least one contact over the silicide region, wherein the at least one contact overlaps at least a part of the first active region and at least a part of the second active region.

10. The method of claim 1, further comprising:
    forming a silicide region in the source region that connects a portion of the first active region in the source region to a portion of the second active region in the source region, wherein the first active region includes a body region between the sidewalls of the first active region, outside the channel region and under the gate structure, and wherein the silicide region provides a connection between the body region and the portion of the first active region in the source region, and wherein the silicide region in the source region extends through the portion of the second active region in the source region to the insulator layer.

11. The method of claim 1, wherein patterning the semiconductor layer further comprises creating a third active region adjacent the second active region, and a fourth active region adjacent the third active region, the second active region between the first and third active regions, and the third active region between the second and fourth active regions, and wherein the forming the gate structure comprises forming the gate structure over at least a portion of the third and fourth active regions, wherein portions of the first and third active regions underlying the gate structure have a same height and same conductivity type, and portions of the second and fourth active regions underlying the gate structure have a same height and same conductivity type.

12. The method of claim 11, wherein the channel region is also located along a top portion and sidewall portions of the third active region adjacent the gate structure.

13. The method of claim 11, wherein the removing the portion of the second active region from only the drain region to expose the insulator layer comprises removing portions of the second and fourth active regions from only the drain region to expose the underlying insulator layer.

14. A method of making a semiconductor device, comprising:
forming a semiconductor layer, overlying an insulator layer, wherein the semiconductor layer includes a first active region and a second active region, wherein the first active region is of a different height from the second active region;
forming a gate structure over a top portion and sidewall portions of the first active region and over at least a portion of the second active region, wherein a channel region is located along the top portion and the sidewall portions of the first active region, adjacent the gate structure, and wherein the channel region is lightly doped with a first conductivity type and the at least a portion of the second active region under the gate structure is heavily doped with the first conductivity type, and
after forming the gate structure, removing a portion of the second active region from only a drain region of the semiconductor device to expose the insulator layer.

15. The method of claim 14, further comprising performing a source/drain implant wherein, after the source/drain implant, a portion of the first active region extending out from under the gate structure has an opposite conductivity type from the first conductivity type.

16. The method of claim 14, further comprising forming a silicide region in a source region of the semiconductor device, that connects a portion of the first active region in the source region to a portion of the second active region in the source region, the silicide region extending through the portion of the second active region in the source region to the insulator layer.

17. The method of claim 14, wherein the semiconductor layer further comprises a third active region adjacent the second active region, and a fourth active region adjacent the third active region, the second active region between the first and third active regions, and the third active region between the second and fourth active regions, and wherein the forming the gate structure further comprises forming the gate structure over at least a portion of the third and fourth active regions, wherein portions of the first and third active regions underlying the gate structure have a same height and same conductivity type, and portions of the second and fourth active regions underlying the gate structure have a same height and same conductivity type.

18. The method of claim 17, wherein the channel region is also located along a top portion and sidewall portions of the third active region adjacent the gate structure.

* * * * *